United States Patent [19]

Sadamatsu

[11] Patent Number: 5,237,195

[45] Date of Patent: Aug. 17, 1993

[54] SEMICONDUCTOR INTEGRATED CIRCUIT ARRANGEMENT FOR PREVENTING LATCH UP

[75] Inventor: Hideaki Sadamatsu, Hirakata, Japan

[73] Assignee: Matsushita Electric Industrial Co., Ltd., Osaka, Japan

[21] Appl. No.: 729,584

[22] Filed: Jul. 15, 1991

[30] Foreign Application Priority Data

Jul. 18, 1990 [JP] Japan .................................. 2-188024

[51] Int. Cl.⁵ ..................... H01L 27/02; H01L 29/68; H01L 29/78
[52] U.S. Cl. .................................. 257/372; 257/379; 257/392; 257/394
[58] Field of Search ..................... 357/51, 42, 23.8, 44; 257/372, 379, 392, 394

[56] References Cited

U.S. PATENT DOCUMENTS

| | | |
|---|---|---|
| 3,990,092 | 11/1976 | Yoshimura . |
| 4,161,417 | 7/1979 | Yim et al. ............................... 357/42 |
| 4,660,067 | 4/1987 | Ebina .................................... 357/42 |
| 4,740,827 | 4/1988 | Niitsu et al. ............................ 357/42 |
| 4,805,008 | 2/1989 | Yao et al. ............................... 357/42 |
| 4,862,240 | 8/1989 | Watanabe et al. ....................... 357/42 |
| 4,922,317 | 5/1990 | Mihara ................................... 357/42 |
| 4,952,992 | 8/1990 | Blanchard ............................ 357/23.4 |
| 5,142,348 | 8/1992 | Imahashi et al. ........................ 357/43 |
| 5,142,641 | 8/1992 | Fujioka ................................... 357/42 |

FOREIGN PATENT DOCUMENTS 57-166070 10/1982 Japan .

OTHER PUBLICATIONS

G. J. Hadamard, "Integrated Circuits Having Reduced Parasitic Thyratron Effects", IBM Technical Disclosure Bulletin, vol. 14, No. 4, Sep. 1971, p. 1076.

Primary Examiner—Rolf Hille
Assistant Examiner—Mahshid Saadat
Attorney, Agent, or Firm—Wenderoth, Lind & Ponack

[57] ABSTRACT

A semiconductor integrated circuit arrangement prevents the occurrence of latch up. The circuit includes a first semiconductor island of a first conductivity type and a second semiconductor island of the first conductivity type located within a base semiconductor region of a second conductivity type. A resistive diffusion region of the second conductivity type is located within the first semiconductor island region. The second semiconductor region is connected to ground. A high potential electrode connected to the resistive diffusion region is also connected to the first semiconductor island region. In this manner, an emitter and a base of a parasitic transistor of the integrated circuit are connected together to prevent the parasitic transistor from operating in a conductive state, thereby preventing latch up.

6 Claims, 6 Drawing Sheets

SEMICONDUCTOR INTEGRATED CIRCUIT ARRANGEMENT FOR PREVENTING LATCH UP

BACKGROUND OF THE INVENTION

The present invention generally relates to a high quality semiconductor integrated circuit, and more particularly, to a semiconductor integrated circuit in which a latch up condition is avoided.

In the conventional semiconductor integrated circuit, one resistor is provided within one island to increase the degree of integration without taking the electric potential of the island. A description of the conventional circuit will be effected hereinafter with reference to pattern chart of FIG. 5a, an equivalent circuit diagram of FIG. 5b and a sectional view of FIG. 5c. Reference numeral 21 is an n-type island area, reference numeral 22 is a p-type resistance area within the n-type island area 21, and reference numerals 23 and 24 are electrodes taken out from the p-type resistance area 22, with reference numeral 23 being provided at the side of a higher electric potential. Reference numeral 25 is an n-type island area, reference numeral 26 is a p-type separating area for separating the n-type island are 21 from the n-type island area 25, and reference numerals 27 and 28 are electrodes taken out from the n-type island area 25. The electrode 28 is connected with a ground electrode 30 through a p-type resistor 29. When one p-type resistance area 22 is placed within one n-type island area 21, current does not flow between the n-type island area 21 and the p-type resistance area 22 even if the n-type island area 21 is kept floating. Therefore, it is not necessary to obtain the potential of the island area 21. The integration degree is increased with respect to the following two points: (1) a connection area connecting the n-type island area 21 with an electrode is unnecessary, and (2) a connection pattern between a high potential (power supply voltage) and the n-type island area 21 is unnecessary.

In such a case as shown in FIG. 5a, namely, when the n-type island area 25 is relatively close to the n-type island area 21 with the other p-type resistor 29 connected with the n-type island area 25 being grounded, a parasitic PNP transistor 31 is formed in which the p-type resistance area 22, the n-type island area 21 and the p-type separation area 26 respectively constitute an emitter, a base and a collector, and a parasitic NPN transistor 32 is formed in which the n-type island area 21, the p-type separation area 26 and the n-type island area 25 respectively constitute a collector, a base and an emitter. The parasitic transistors 31 and 32 together form a PNPN type thyristor. Since the p-type separation area 26 is spaced away from the ground, an additional resistor 33 is provided between the p-type separation area 26 and ground. The resultant equivalent circuit is shown in FIGS. 5b and 5c. When the p-type separation area 26 is spaced away from the ground, the potential thereof becomes higher so as to turn on the parasitic NPN transistor 32. When the parasitic NPN transistor 32 is turned on, a collector current of the parasitic PNP transistor 31 flows which is a base current of the parasitic PNP transistor 31. The parasitic PNP transistor 31 turns on and a collector current of the parasitic PNP transistor 31 flows which is a $h_{FE}$ magnification of the base current. The base potential of the parasitic NPN transistor 32 is then further increased by the resistor 33 and more currents are caused to flow. As a result, the currents increase until the parasitic PNP transistor 31 and the parasitic NPN transistor 32 are saturated. Particularly when the resistor 33 is small, or does not exist, excessive currents flow. This latch up condition is especially likely to occur in the case of the PNPN.

SUMMARY OF THE INVENTION

Accordingly, the present invention has been developed with a view to substantially eliminating the above discussed drawbacks inherent in the prior art, and has for its essential object to provide an improved semiconductor integrated circuit in which is a simple circuit construction requiring a small amount of additional area is capable of avoiding a latch up condition.

In accomplishing these and the objects, according to one preferred embodiment of the present invention, there is provided a semiconductor integrated circuit in which the base of a parasitic PNP transistor is connected to the emitter thereof, or to one portion of a resistor connected to the emitter, to thereby turn the base potential into at least the emitter potential to prevent the parasitic PNP transistor from operating in a conductive state.

By the above describe construction, the base current of the parasitic PNP transistor becomes zero, and the collector current also becomes zero. Therefore, the voltage of the parasitic resistance located between the collector of the parasitic PNP transistor and ground becomes smaller, thus reducing the base potential of the parasitic PNP transistor, so that the parasitic NPN transistor is not turned on. Therefore, since the parasitic NPN transistor current does not flow, the latch up condition is not caused.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1A:
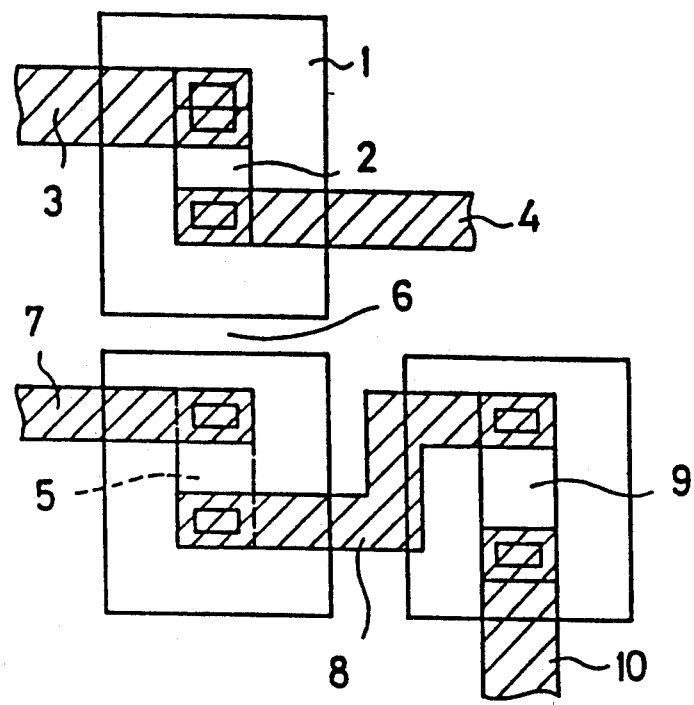
FIGS. 1a and 1b, FIGS. 1a and 2b, FIGS. 3a and 3b FIGS. 4a and 4b are respective diagrams of a surface pattern and an equivalent circuit of the semiconductor integrated circuit in the embodiments of the present invention.

Before the description of the present invention proceeds, it is to be noted that like parts are designated by life reference numerals throughout the accompanying drawings.

Figure 1B:
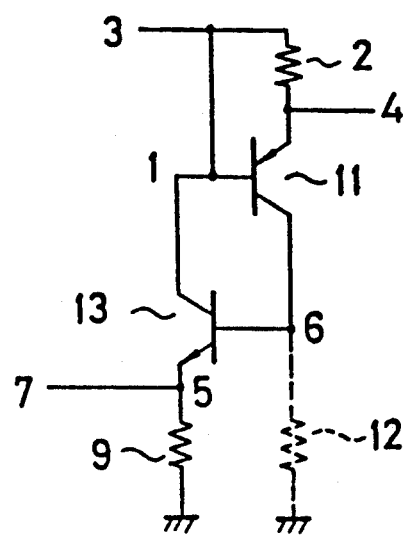
Figure 1C:
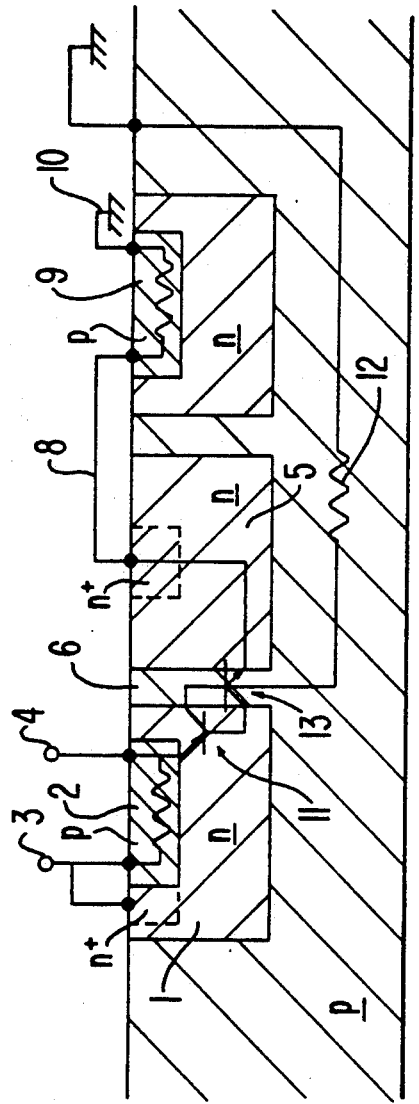
FIG. 1c is a sectional view of the semiconductor integrated circuit in an embodiment of the present invention.
Figure 5C:
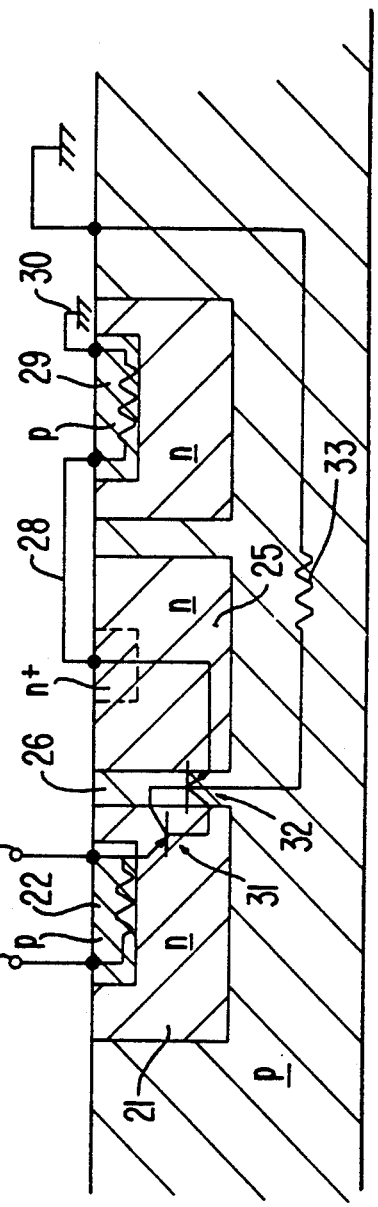
FIGS. 5a thru 5c are respective diagrams of a surface pattern, an equivalent circuit and a sectional view of the conventional semiconductor integrated circuit.

Referring now to the drawings, there is shown in FIGS. 1a preferred embodiment of the present invention, in which FIG. 1a depicts a surface pattern, FIG. 1b depicts an equivalent circuit diagram and FIG. 1c depicts a sectional view.

Reference numeral 1 is an n-type island area, reference numeral 2 is a p-type resistance area, reference numeral 3 is an electrode connected to the n-type island area and connected to the high potential side of the p-type resistance area 2, reference numeral 4 is a low potential side electrode of the p-type resistance area 2, reference numeral 5 is an n-type island area, reference numeral 6 is a p-type separation area for separating the n-type island area 1 from the n-type island area 5, reference numerals 7 and 8 are electrodes for connecting the n-type island areas, and reference numeral 9 is a resistor for connecting the n-type island area with a ground electrode 10. The circuit diagram of FIG. 1b shows the equivalent circuit of the pattern diagram of FIG. 1a and the sectional view of FIG. 1c, with the numerals of the respective areas and the positional numerals of the equivalent circuit being unified. Since the base of the parasitic PNP transistor 11 is connected to the high potential side electrode 3 of the p-type resistance area 2, the base potential becomes higher than the emitter potential, resulting in the parasitic PNP transistor 11 being turned off. Therefore, since current does not flow into the resistor 12 and the potential of the p-type separating area 6 of the parasitic NPN transistor 13 is low, the NPN transistor 13 is also turned off. Therefore, current does not flow, and a latch up condition is not caused.

Figure 2A:
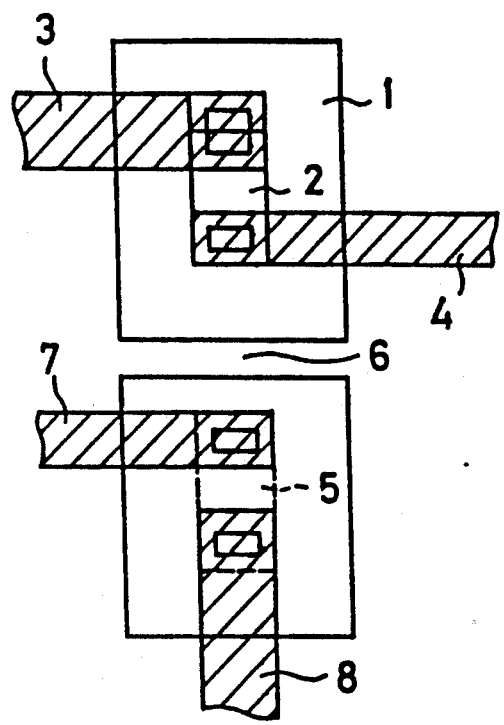
Figure 2B:
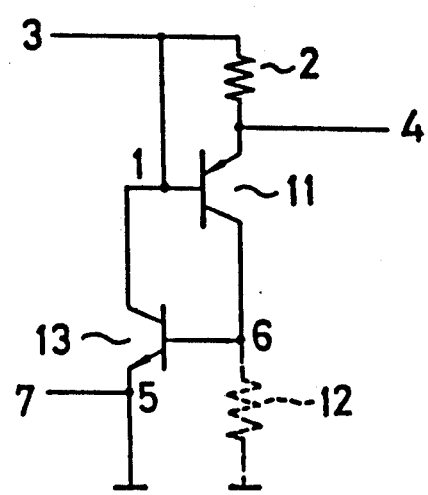

FIGS. 2a and 2b show a second embodiment of the present invention, with numerals 1 through 8 being similar to those of FIGS. 1a thru 1c. In the case of the second embodiment, even though the emitter of the parasitic NPN transistor 13 is directly grounded, no latch up condition is caused.

Figure 3A:
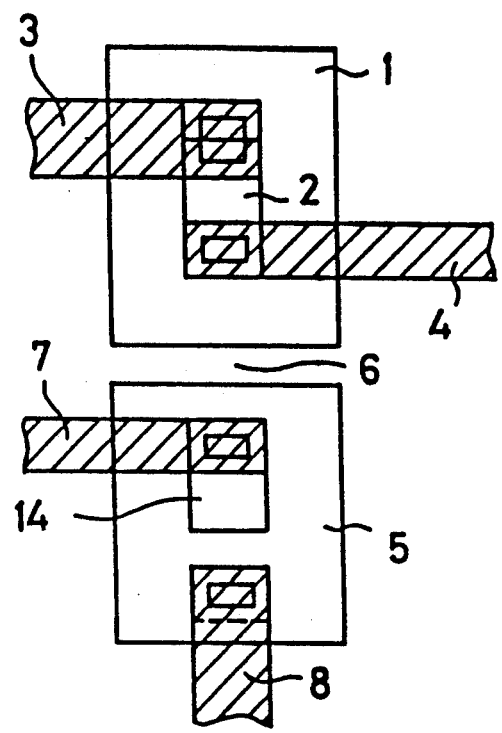
Figure 3B:
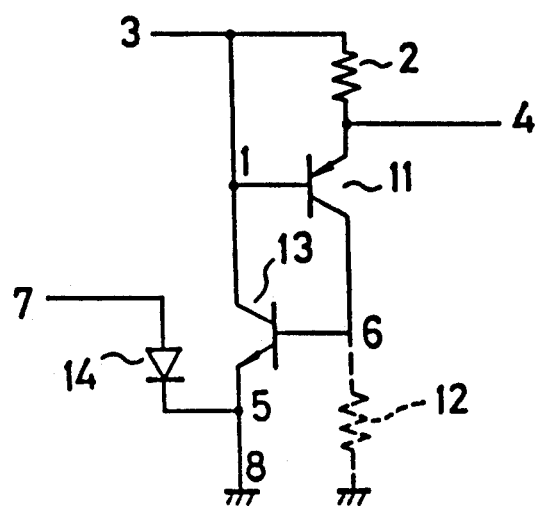

FIGS. 3a and 3b show a third embodiment of the present invention, with the numerals 1 through 8 being similar to those of FIGS. 1a thru 1c. Reference numeral 14 is a p-type diffusion area formed within the n-type island area 5, with the diode being equivalently connected. A latch up condition may be prevented even in a case where such a diode is present.

Figure 4A:
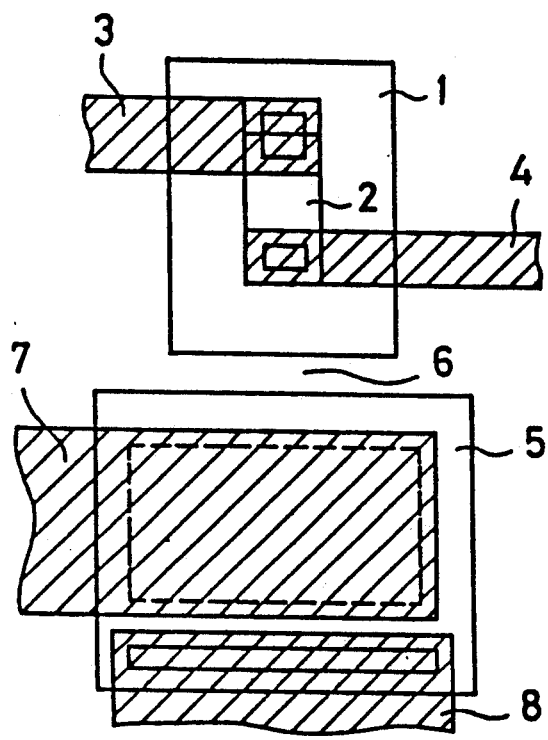
Figure 4B:
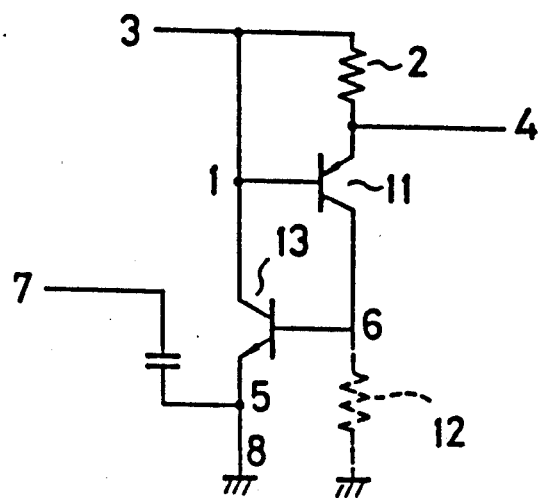
Figure 5A:
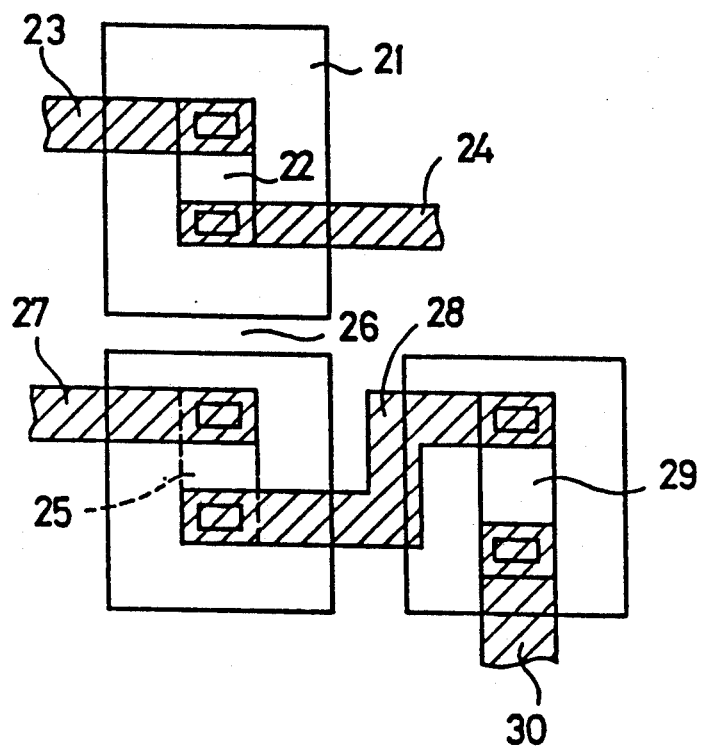
Figure 5B:
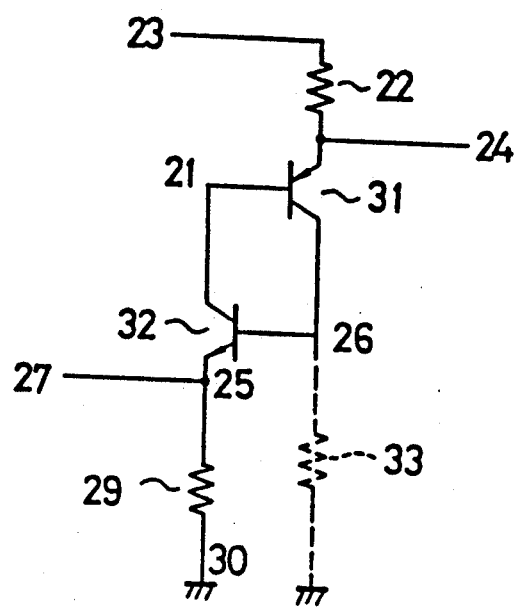

FIGS. 4a and 4b show a fourth embodiment of the present invention, with the numerals 1 through 8 being similar to those of FIGS. 1a thru 1c. In this case, an electrode 7 is provided on the n-type island area 5, and a capacitor is composed between the n-type island area 5 and the electrode 7. A latch up condition may be prevented even in a case where such a capacitor is present.

Although the emitter of the parasitic NPN transistor 13 is directly grounded in the third and fourth embodiments, the same effects can be achieved even in a case where a resistor is connected between the emitter of the NPN transistor 13 and ground.

As is clear from the foregoing description, according to the arrangement of the present invention, using an extremely simple circuit construction and a small amount of additional area, the latch up condition can be avoided. A semiconductor integrated circuit of high quality and reliability is thus obtained, resulting in substantial practical usage.

Although the present invention has been fully described by way of example with reference to the accompanying drawings, it is to be noted here that the various changes and modifications will be apparent to those skilled in the art. Therefore, unless otherwise such changes and modifications depart from the scope of the present invention, they should be construed as included therein.

What is claimed is:

1. A semiconductor integrated circuit comprising:
   first and second semiconductor island regions having a first type of conductivity located adjacent each other within a base semiconductor region having a second type of conductivity, said first and second semiconductor island regions being spaced apart from each other by a separation region having said second type of conductivity, said second semiconductor island region being connected to a ground;
   a first resistive diffusion region having said second type of conductivity located within said first semiconductor island region;
   first and second electrodes spaced apart from each other and connected to said first resitive diffusion region, said first electrode having a higher potential than said second electorde; and,
   a third electorde connected to said first semiconductor island region and to said first electrode.

2. A semiconductor integrated circuit as claimed in claim 1, further comprising a second resistive diffusion region connected between said ground and said second semiconductor island region.

3. A semiconductor integrated circuit as claimed in claim 1, further comprising a diffusion region having said second type of conductivity located within said second semiconductor island region, wherein said diffusion region forms an anode and said second semiconductor island region forms a cathode of a diode element.

4. A semiconductor integrated circuit as claimed in claim 2, further comprising a diffusion region having said second type of conductivity located within said second semiconductor island region, wherein said diffusion region forms an anode and said second semiconductor island region forms a cathode of a diode element.

5. A semiconductor integrated circuit as claimed in claim 1, further comprising a fourth electorde connected to said second semiconductor island region, wherein said fourth electrode and said second semiconductor island region form a capacitive element.

6. A semiconductor integrated circuit as claimed in claim 2, further comprising a fourth electorde connected to said second semiconductor island region, wherein said fourth electrode and said second semiconductor island region form a capacitive element.

* * * * *